US012640758B2

(12) United States Patent
Ishihara et al.

(10) Patent No.: US 12,640,758 B2
(45) **Date of Patent: \*May 26, 2026**

(54) TRANSMISSION CIRCUIT

(71) Applicants: TOKYO INSTITUTE OF TECHNOLOGY, Tokyo (JP); KYOCERA Corporation, Kyoto (JP)

(72) Inventors: Noboru Ishihara, Tokyo (JP); Shinsuke Tsuru, Yokohama (JP); Tomonao Yuzawa, Kawasaki (JP); Shinji Isoyama, Yokohama (JP)

(73) Assignees: TOKYO INSTITUTE OF TECHNOLOGY, Tokyo (JP); KYOCERA CORPORATION, Kyoto (JP)

(\*) Notice: Subject to any disclaimer, the term of this patent is extended or adjusted under 35 U.S.C. 154(b) by 360 days.

This patent is subject to a terminal disclaimer.

(21) Appl. No.: 18/245,717

(22) PCT Filed: Aug. 23, 2021

(86) PCT No.: PCT/JP2021/030870
§ 371 (c)(1),
(2) Date: Mar. 17, 2023

(87) PCT Pub. No.: WO2022/070676
PCT Pub. Date: Apr. 7, 2022

(65) Prior Publication Data
US 2023/0361793 A1      Nov. 9, 2023

(30) Foreign Application Priority Data
Sep. 29, 2020      (JP) ................................. 2020-163974

(51) Int. Cl.
*H04B 1/04*      (2006.01)
*H03H 7/18*      (2006.01)

(52) U.S. Cl.
CPC ................. *H04B 1/04* (2013.01); *H03H 7/18* (2013.01)

(58) Field of Classification Search
CPC .................................... H03H 7/18; H04B 5/77
(Continued)

(56) References Cited

U.S. PATENT DOCUMENTS 7,796,016 B2      9/2010   Fukuda
10,002,266 B1     6/2018   Hyde et al.
(Continued)

FOREIGN PATENT DOCUMENTS

JP        2005323223 A      11/2005

OTHER PUBLICATIONS

Firrao Ettore Lorenzo et al, "Hardware Implementation Overhead of Switchable Matching Networks", IEEE Transactions on Circuits and Systems I: Regular Papers, May 1, 2017, pp. 1152-1163, vol. 64, No. 5, XP011647163, IEEE, US, 12pp.
(Continued)

*Primary Examiner* — Fabricio R Murillo Garcia
(74) *Attorney, Agent, or Firm* — HAUPTMAN HAM, LLP

(57)      ABSTRACT

A transmission circuit includes: a plurality of impedance circuits having impedances different from each other, a plurality of first switch elements, any one of which is being connected to a respective one of the plurality of impedance circuits, and a first control circuit configured to control opening and closing of the plurality of first switch elements. The first control circuit is configured to be controllable to selectively change the opening and closing of the plurality of first switch elements and to rotate a reflection coefficient of an output terminal on an antenna side of the transmission circuit in a complex plane.

19 Claims, 15 Drawing Sheets

(58) Field of Classification Search
USPC .......................................................... 455/91
See application file for complete search history.

(56) References Cited

U.S. PATENT DOCUMENTS

| | | | | |
|---|---|---|---|---|
| 2005/0253688 A1 | 11/2005 | Fukuda | | |
| 2010/0027445 A1* | 2/2010 | Matsuura | ............. | H04B 1/0475 |
| | | | | 370/278 |
| 2011/0189964 A1* | 8/2011 | Jeon | ......................... | H03H 7/40 |
| | | | | 455/114.2 |
| 2014/0120852 A1* | 5/2014 | Ashizuka | ............. | H04B 1/0458 |
| | | | | 455/127.1 |
| 2014/0177855 A1* | 6/2014 | Polinske | ................. | H04B 1/30 |
| | | | | 381/60 |
| 2015/0214985 A1 | 7/2015 | Lee et al. | | |
| 2016/0182003 A1* | 6/2016 | Teshima | ................... | H03H 7/38 |
| | | | | 333/32 |
| 2018/0234080 A1 | 8/2018 | Shrivastava | | |
| 2019/0020313 A1* | 1/2019 | Perreault | ................. | H03F 3/245 |
| 2025/0150114 A1 | 5/2025 | Ishihara et al. | | |
| 2025/0158644 A1 | 5/2025 | Ishihara et al. | | |

OTHER PUBLICATIONS

Henry G Follingstad, "Complete Linear Characterization of Transistors from Low Through Very High Frequencies", Ire Transactions on Instrumentation, Mar. 1, 1957, pp. 49-63, vol. I-10, No. 1, XP011259259, IEEE, USA, 15pp.

* cited by examiner

1

TRANSMISSION CIRCUIT

RELATED APPLICATIONS

The present application is a National Phase of International Application Number PCT/JP2021/030870 filed Aug. 23, 2021, which claims the benefit of priority from Japanese Patent Application No. 2020-163974, filed on Sep. 29, 2020.

TECHNICAL FIELD

The present disclosure relates to a transmission circuit.

BACKGROUND OF INVENTION

A backscatter system is known as a data communication method of a wireless communication apparatus. For example, Patent Document 1 discloses a technique for implementing a single side band by suppressing either an upper side band (USB) signal or a lower side band (LSB) signal by using a demultiplexer/multiplexer.

CITATION LIST

Patent Literature

Patent Document 1: JP 2005-323223 A

SUMMARY

Problem to be Solved

In a radio frequency identification (RFID) system that performs data communication of a backscatter system, miniaturization of a wireless communication apparatus is required. However, in Patent Document 1, a demultiplexer/multiplexer is used to implement a single side band, and thus a configuration is disadvantageous for miniaturization.

The present disclosure is directed to providing a transmission circuit capable of miniaturizing a wireless communication apparatus of a backscatter system.

Solution to Problem

In one aspect of the present disclosure, a transmission circuit is configured to be connected to an antenna. The transmission circuit includes: a plurality of impedance circuits having impedances different from each other; a plurality of first switch elements, any one of which is being connected to a respective one of the plurality of impedance circuits; a first control circuit configured to control opening and closing of the plurality of first switch elements. The first control circuit is configured to be controllable to selectively change the opening and closing of the plurality of first switch elements and to rotate a reflection coefficient of an output terminal on an antenna side of the transmission circuit in a complex plane.

Advantageous Effect

According to the present disclosure, a wireless communication apparatus of a backscatter system can be miniaturized.

DESCRIPTION OF EMBODIMENTS

Figure 1:
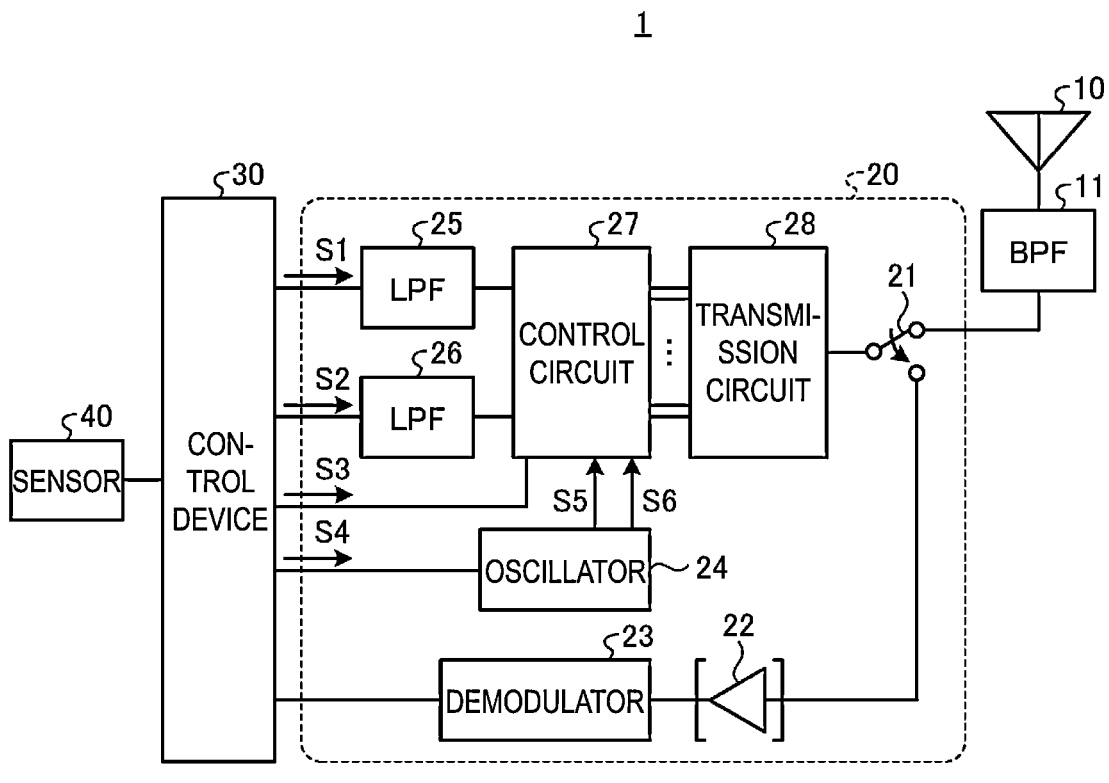
FIG. 1 is a block diagram illustrating an example of a configuration of a wireless communication apparatus according to a first embodiment.

Embodiments according to the present disclosure will now be described in detail with reference to the accompanying drawings. Note that the present disclosure is not limited by the embodiments, and when there is a plurality of embodiments, the scope of the present disclosure includes a combination of the embodiments. In the following embodiments, the same reference numerals are assigned to the same portions and redundant descriptions thereof will be omitted.

First Embodiment

A configuration of a wireless communication apparatus according to a first embodiment will be described with reference to FIG. 1. FIG. 1 is a block diagram illustrating an example of a configuration of the wireless communication apparatus according to an embodiment.

As illustrated in FIG. 1, a wireless communication apparatus 1 includes an antenna 10, a band pass filter (BPF) 11, a radio frequency back scatter (RFBS) device 20, a control device 30, and a sensor 40. The wireless communication apparatus 1 is a communication apparatus configured to perform wireless communication of a backscatter system such as an RFID.

The antenna 10 is configured to receive a signal transmitted to the wireless communication apparatus 1. The antenna 10 is configured to transmit a radio wave towards the outside of the wireless communication apparatus 1. The BPF 11 is a filter configured to pass a signal in a desired frequency band.

The RFBS device 20 includes a high frequency switch 21, an amplifier 22, a demodulator 23, an oscillator 24, a low pass filter (LPF) 25, an LPF 26, a control circuit 27, and a transmission circuit 28. The RFBS device 20 is a wireless communication device that supports data communication of the backscatter system. In the data communication of the backscatter system, communication is performed using reflection of the transmitted radio wave.

The high frequency switch 21 is configured to switch connection between the antenna 10 and a transmission circuit system or a reception circuit system. The high frequency switch 21 is configured to be able to connect the transmission circuit system to the antenna 10. The wireless communication apparatus 1 is configured to transmit when the antenna 10 and the transmission circuit system are connected. The high frequency switch 21 is configured to be able to connect the reception circuit system to the antenna 10. The transmission circuit system includes the oscillator 24, the LPF 25, the LPF 26, the control circuit 27, and the transmission circuit 28. The reception circuit system includes the amplifier 22, the demodulator 23.

The amplifier 22 is configured to amplify the signal received from the antenna 10 and output the amplified signal. The amplifier 22 is configured to output the amplified signal to the demodulator 23. The demodulator 23 is configured to execute demodulation processing on an input signal. The demodulator 23 is configured to demodulate a signal received from the amplifier 22. For example, the demodulator 23 is configured to execute demodulation processing on the signal (modulation signal such as amplitude shift keying (ASK)) received from the amplifier 22.

The control device 30 is implemented by, for example, a program stored inside executed by a processor or the like with a random access memory (RAM) or the like as a work area. The control device 30 may be a controller. The control device 30 may also be implemented by an integrated circuit such as an application specific integrated circuit (ASIC) or a field programmable gate array (FPGA). The control device 30 may be implemented by a combination of software and hardware.

The control device 30 is configured to output a serial data S1 to the control circuit 27 via the LPF 25. The serial data S1 is based on output data from the sensor 40. The control device 30 outputs a serial data S2 to the control circuit 27 via the LPF 26. The serial data S2 is based on the output data from the sensor 40. The serial data S1 has a phase different from the serial data S2 by approximately 90°.

The control device 30 is configured to output a control signal S3 to the control circuit 27. The control signal S3 may be utilized to suppress either the USB signal or the LSB signal with respect to a carrier signal. The control device 30 is configured to output a control signal S4 to the oscillator 24. The control signal S4 may be utilized to control a channel used for communication.

The sensor 40 is configured to detect various physical quantities. The physical quantities detected by the sensor 40 are not particularly limited. The sensor 40 may include, for example, one or both of a temperature sensor configured to detect a temperature around the wireless communication apparatus 1, and an acceleration sensor configured to detect acceleration that is generated in the wireless communication apparatus 1. The sensor 40 may include other sensors.

The oscillator 24 is configured to generate an oscillation signal of a predetermined frequency. The oscillator 24 is configured to generate an oscillation signal S5 according to the control signal S4. The oscillator 24 is configured to generate an oscillation signal S6 having a phase different from the oscillation signal S5 by 90°.

The control circuit 27 is configured to control the transmission circuit 28. The control circuit 27 is configured to control the transmission circuit 28 to adjust a value of an impedance of the transmission circuit 28 based on the serial data S1, the serial data S2, and the control signal S3. The control circuit 27 is configured to change the impedance of the transmission circuit 28. Due to the change in the impedance, a reflection coefficient of an output terminal on the antenna 10 side rotates in a complex plane. The control circuit 27 is configured to change the impedance of the transmission circuit 28 to control the reflection coefficient of the output terminal to rotate in the complex plane. For example, the control circuit 27 is configured to control the impedance of the transmission circuit 28 so as to reduce the USB signal or the LSB signal with respect to the carrier signal in a reflection signal (hereinafter, also referred to as the backscatter signal) to implement the single side band.

Figure 2:
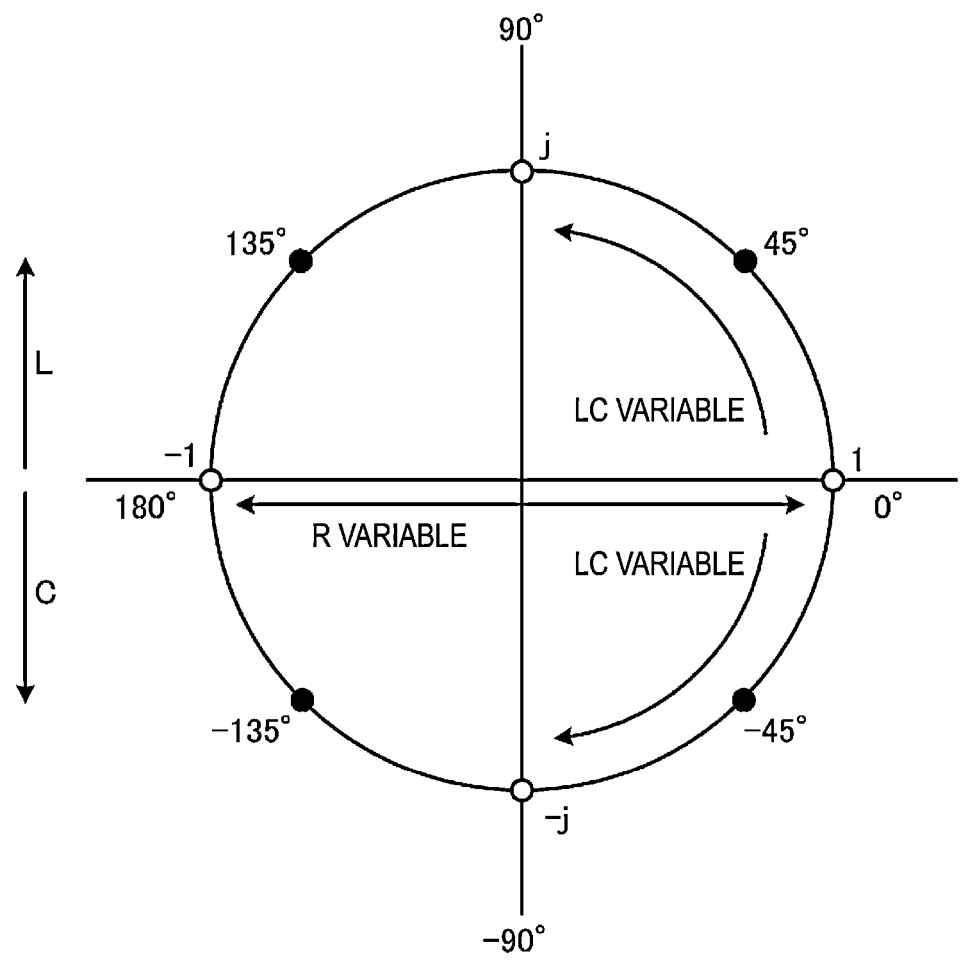
FIG. 2 is a diagram for describing a method of rotationally controlling impedance in a complex plane according to the first embodiment.

A method will be described by using a polar chart (polar coordinate) in FIG. 2, in which the control circuit 27 controls the reflection coefficient of the output terminal on the antenna 10 side of the transmission circuit 28 so as to rotate on the complex plane of the polar chart. FIG. 2 is a diagram for describing a method in which the control circuit 27 changes the impedance of the transmission circuit 28 to control the reflection coefficient of the output terminal to rotate.

FIG. 2 is a diagram illustrating a change in a reflection coefficient Γ due to the change in the impedance on the polar chart. The impedance is calculated by the following equation (1). In the equation (1), z is impedance, R is resistance, j is an imaginary number, ω is an angular frequency, L is inductance, and C is capacitance.

$$Z=R+j(\omega L-1/\omega C) \tag{1}$$

The reflection coefficient Γ is represented by the following equation.

$$\Gamma=(Z-Z_0)/(Z+Z_0) \tag{2}$$

Here $Z_0$ is an impedance of the antenna 10 or the BPF 11.

The control circuit 27 selectively controls the impedance Z to control the reflection coefficient Γ so as to rotate around a reference point. The reference point includes the origin, but is not limited to the origin and includes any point. The closer to the origin the reference point is, the closer to the ideal signal the transmission circuit can obtain. The more a circumference of the reference point is controlled to circularly rotate, the closer to the ideal signal the transmission circuit can obtain. In consideration in a Smith chart, a lower semicircular region indicates a capacitive property, and an upper half indicates an inductive property. A change on the real axis represents a change in a resistance value.

The control circuit 27 can selectively control a plurality of the impedances included in the transmission circuit 28. For example, the control circuit 27 is configured to control the impedance of the transmission circuit 28 in 45° increments of 0°, 45°, 90°, 135°, 180°, −135°, −90°, −45°. The control circuit 27 is configured to be controllable to discretely rotate the impedance by sequentially changing the impedance of the transmission circuit 28. The control circuit 27 discretely rotates the reflection coefficient Γ in response to discrete rotation of the impedance.

The control circuit 27 is configured to be able to change the impedance in counterclockwise rotation by a changing order of the impedance of the transmission circuit 28. The control circuit 27 is configured to be able to change the reflection coefficient Γ in the counterclockwise rotation by the counterclockwise rotation of the impedance. When the control of the reflection coefficient is counterclockwise rotation, the reflection signal with respect to the radio frequency (RF) is only the upper side band (USB) signal. When the reflection coefficient is controlled to be clockwise rotation, only the lower side band (LSB) signal is obtained. At that time, the frequency of the reflection signal is detuned from the RF signal frequency by a rotation speed frequency. Several examples of change in the backscatter signal due to change of the impedance to control the reflection coefficient will be described with reference to FIGS. 3A, 3B, and 3C.

Figure 3A:
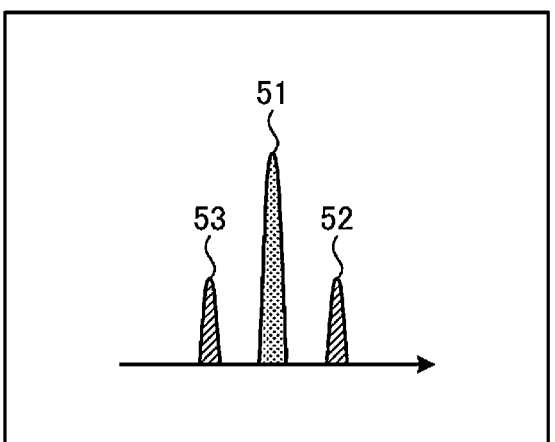
FIG. 3A is a diagram for describing a change in a backscatter signal.

FIG. 3A is a diagram illustrating a frequency spectrum for describing a state of the backscatter signal when the control circuit 27 controls only a resistive component of the impedance, and changes the reflection coefficient Γ on the real axis of the polar chart (FIG. 2). The horizontal axis represents the frequency, and the vertical axis represents the intensity of the RF signal and the reflection signal. In FIG. 3A, a carrier signal 51, a USB signal 52, and an LSB signal 53 are illustrated. When the resistive component is controlled, the reflection coefficient Γ is controlled to either 0° or 180° on the real axis. When the impedance is changed by only the resistive component to control the reflection coefficient Γ, as illustrated in FIG. 3A, the clockwise signal component and the counterclockwise signal component are present in switching from 0° to 180°, for example. The signal components in the two rotational directions are present, and thus the USB signal 52 and the LSB signal 53 appear simultaneously, and only one of the signals cannot be selectively suppressed. As a result, an SSB signal cannot be obtained by controlling only the resistive component.

Figure 3B:
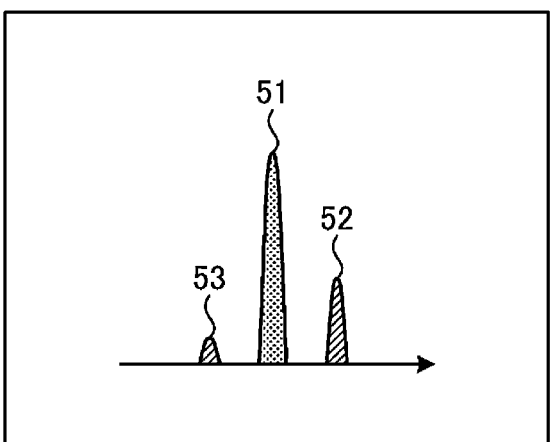
FIG. 3B is a diagram for describing a change in a backscatter signal.

FIG. 3B is a diagram illustrating a frequency spectrum for describing a change in the backscatter signal when the control circuit 27 changes inductance/capacitance of the impedance to control a trajectory of the reflection coefficient Γ so as to form a circle. The horizontal axis represents the frequency, and the vertical axis represents the intensity of the RF signal and the reflection signal. Based on the equations (1) and (2), the control circuit 27 is controllable to rotate the impedance counterclockwise by controlling a value of the inductance. At this time, the impedance is rotated counterclockwise, for example, from 0° to 45°, 90°, and 135°. The control circuit 27 is controllable to rotate the impedance counterclockwise by further controlling a value of the capacitance. At this time, the impedance is rotated counterclockwise, for example, from 180° to −135°, −90°, and −45°. As illustrated in FIG. 3B, the control circuit 27 can reflect the transmitted RF signal so as to suppress the LSB signal 53 by controlling the impedance to rotate counterclockwise. In other words, the control circuit 27 can obtain a backscatter signal that is SSB modified to the USB signal 52 by counterclockwise rotation control of the impedance.

Figure 3C:
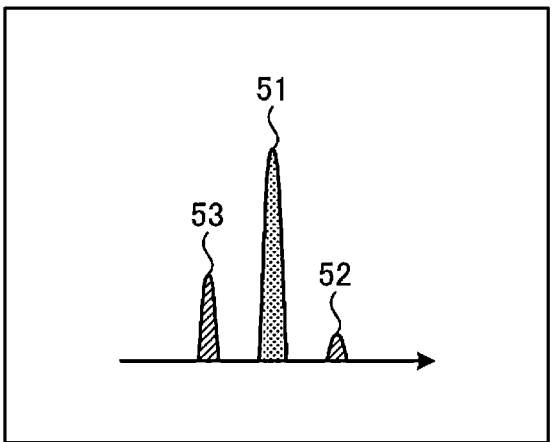
FIG. 3C is a diagram for describing a change in a backscatter signal.

FIG. 3C is a diagram illustrating a frequency spectrum for describing a change in the backscatter signal when the control circuit 27 changes capacitance/inductance of the impedance to control a trajectory of the reflection coefficient Γ to form a circle. The horizontal axis represents the frequency, and the vertical axis represents the intensity of the RF signal and the reflection signal. Based on the equations (1) and (2), the control circuit 27 is controllable to rotate the impedance clockwise by controlling the value of the capacitance. At this time, the impedance is rotated clockwise, for example, from 0° to −45°, −90°, and −135°. The control circuit 27 is controllable to rotate the impedance clockwise by further controlling the value of the inductance. At this time, the impedance is rotated clockwise, for example, to 180°, 135°, 90°, and 45°. As illustrated in FIG. 3C, the control circuit 27 can reflect the transmitted RF signal so as to suppress the USB signal 52 by controlling the impedance to rotate clockwise. In other words, the control circuit 27 can obtain a backscatter signal that is SSB modified to the LSB signal 53 by clockwise rotation control of the impedance.

The transmission circuit 28 is disposed on a front end of the wireless communication apparatus 1. The transmission circuit 28 is a circuit configured to perform backscatter communication in which the transmitted radio wave is reflected as the backscatter signal. The transmission circuit 28 is configured to be connected to the antenna 10. The transmission circuit 28 includes a plurality of impedance circuits having impedances different from each other. Each of the plurality of impedance circuits includes a switch element. The switch element is configured to switch a connection of a corresponding impedance circuit. The control circuit 27 is configured to control the connection of the plurality of impedance circuits by controlling a plurality of the switch elements. The control circuit 27 is configured to control the impedance of the transmission circuit 28 by controlling the plurality of switch elements.

Configuration of Transmission Circuit

Figure 4:
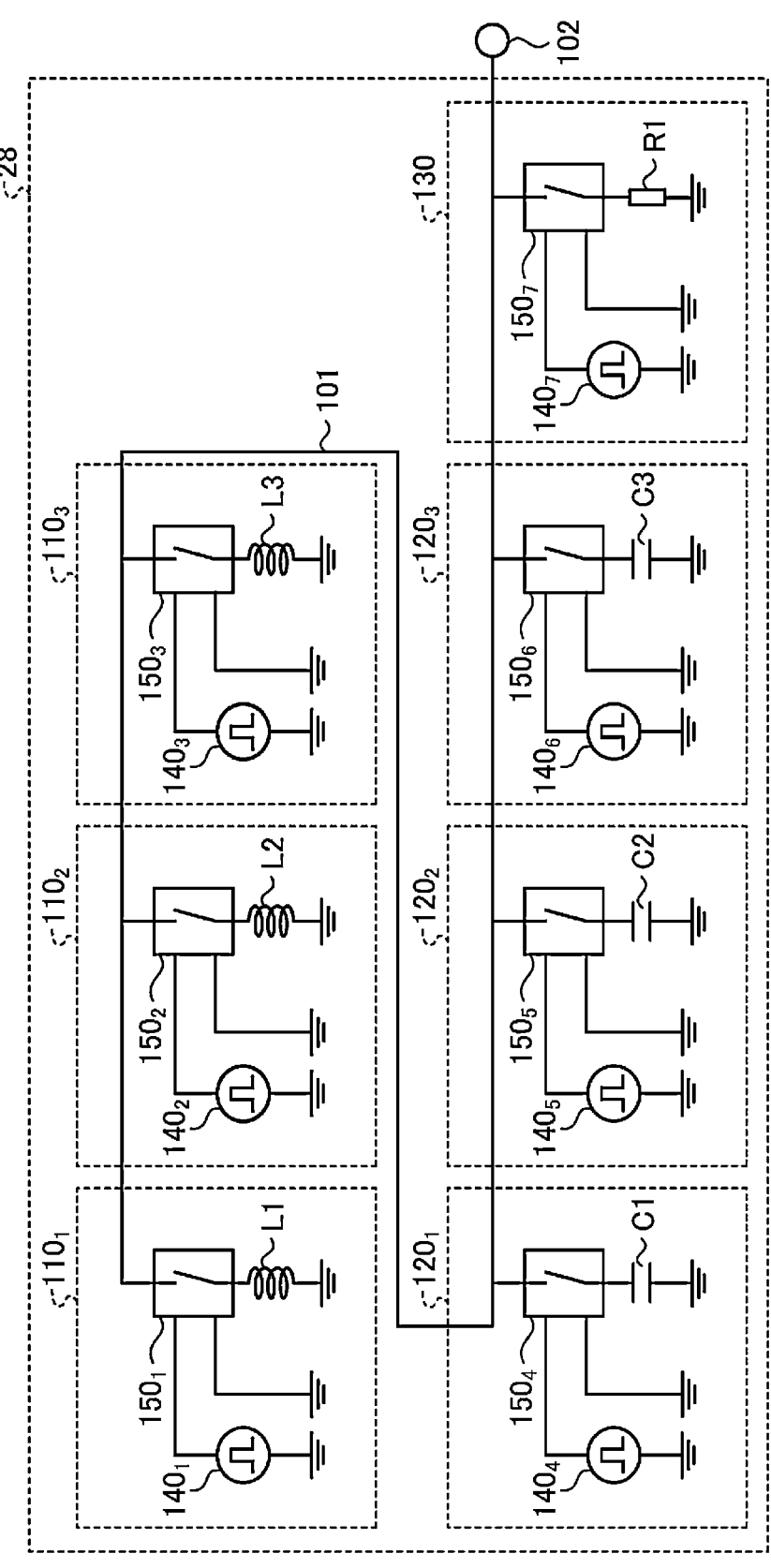
FIG. 4 is a diagram illustrating an example of a configuration of a transmission circuit according to the first embodiment.

A configuration of the transmission circuit according to the first embodiment will be described with reference to FIG. 4. FIG. 4 is a diagram illustrating an example of the configuration of the transmission circuit according to the first embodiment.

As illustrated in FIG. 4, the transmission circuit 28 includes: inductor circuits 110₁, 110₂, and 110₃; capacitor circuits 120₁, 120₂, and 120₃; and a resistive circuit 130. Each of the inductor circuits 110₁ to 110₃, the capacitor circuits 120₁ to 120₃, and the resistive circuit 130 is a type of the impedance circuit. When it is not necessary to particularly distinguish the inductor circuits 110₁ to 110₃ from one another, these may be collectively referred to as an inductor circuit 110. When it is not necessary to particularly distinguish the capacitor circuits 120₁ to 120₃ from one another, these may be collectively referred to as a capacitor circuit 120. In FIG. 4, components less relevant to the present disclosure are omitted.

The inductor circuits 110₁ to 110₃, the capacitor circuits 120₁ to 120₃, and the resistive circuit 130 are electrically connected to each other by a signal line 101. The signal line 101 is electrically connected to an input/output terminal 102. The input/output terminal 102 is electrically connected to a peripheral circuit or the like on the antenna 10 side.

The inductor circuit 110₁ includes a signal source 140₁, a switch element 150₁, and an inductor L1. A signal source 140₁ indicates a signal source to which a control signal from the control circuit 27 is supplied. The signal source 140₁ is configured to output the control signal to the switch element 150₁ to control an opening/closing operation of the switch element 150₁. The switch element 150₁ includes one input terminal to which the signal source 140₁ is connected and the other input terminal to which a reference potential is connected. The reference potential is described as being the ground, but the present disclosure is not limited thereto. The switch element 150₁ is configured to switch between a closed state and an open state in accordance with the control signal from the signal source 140₁.

The switch element $150_1$ includes one end to which the signal line 101 is electrically connected and the other end to which one end of the inductor L1 is electrically connected. The other end of the inductor L1 is connected to the reference potential. In this case, the switch element $150_1$ is configured to electrically connect the signal line 101 and the inductor L1 by being in the closed state. The switch element $150_1$ is configured to electrically separate the signal line 101 from the inductor L1 by being in the open state. The inductance of the inductor L1 is added to the impedance of the transmission circuit 28 by electrically connecting the signal line 101 and the inductor L1. In other words, a reactance component of the impedance of the transmission circuit 28 changes due to addition of the inductance of the inductor L1. The inductance of the inductor L1 is, for example, 3.3 [nano Henry (nH)].

The inductor circuit $110_2$ includes a signal source $140_2$, a switch element $150_2$, and an inductor L2. A signal source $140_2$ indicates a signal source to which a control signal from the control circuit 27 is supplied. The signal source $140_2$ is configured to output the control signal to the switch element $150_2$ to control an opening/closing operation of the switch element $150_2$. The switch element $150_2$ includes one input terminal to which the signal source $140_2$ is connected and the other input terminal to which the reference potential is connected. The reference potential is described as being a ground, but the present disclosure is not limited thereto. The switch element $150_2$ is configured to switch between the closed state and the open state in accordance with the control signal from the signal source $140_2$.

The switch element $150_2$ includes one end to which the signal line 101 is electrically connected and the other end to which one end of the inductor L2 is electrically connected. The other end of the inductor L2 is connected to the reference potential. In this case, the switch element $150_2$ is configured to electrically connect the signal line 101 and the inductor L2 by being in the closed state. The switch element $150_2$ is configured to electrically separate the signal line 101 from the inductor L2 by being in the open state. The inductance of the inductor L2 is added to the impedance of the transmission circuit 28 by electrically connecting the signal line 101 and the inductor L2. In other words, a reactance component of the impedance of the transmission circuit 28 changes due to addition of the inductance of the inductor L2. The inductance of the inductor L2 is, for example, 7.96 [nH].

The inductor circuit $110_3$ includes a signal source $140_3$, a switch element $150_3$, and an inductor L3. The signal source $140_3$ indicates a signal source to which the control signal from the control circuit 27 is supplied. The signal source $140_3$ is configured to output the control signal to the switch element $150_3$ to control an opening/closing operation of the switch element $150_3$. The switch element $150_3$ includes one input terminal to which the signal source $140_3$ is connected and the other input terminal to which the reference potential is connected. The reference potential is described as being the ground, but the present disclosure is not limited thereto. The switch element $150_3$ is configured to switch between the closed state and the open state in accordance with the control signal from the signal source $140_3$. Note that one or more inductor circuits among the inductor circuits $110_1$ to $110_3$ may include one or more electrical elements from a plurality of capacitor elements and a plurality of resistive elements.

The switch element $150_3$ includes one end to which the signal line 101 is electrically connected and the other end to which one end of the inductor L3 is electrically connected. The other end of the inductor L3 is connected to the reference potential. In this case, the switch element $150_3$ is configured to electrically connect the signal line 101 and the inductor L3 by being in the closed state. The switch element $150_3$ is configured to electrically separate the signal line 101 from the inductor L3 by being in the open state. The inductance of the inductor L3 is added to the impedance of the transmission circuit 28 by electrically connecting the signal line 101 and the inductor L3. In other words, a reactance component of the impedance of the transmission circuit 28 changes due to addition of the inductance of the inductor L3. The inductance of the inductor L3 is, for example, 19.21 [nH].

The capacitor circuit $120_1$ includes a signal source $140_4$, a switch element $150_4$, and a capacitor C1. The signal source $140_4$ indicates a signal source to which the control signal from the control circuit 27 is supplied. The signal source $140_4$ is configured to output the control signal to the switch element $150_4$ to control an opening/closing operation of the switch element $150_4$. The switch element $150_4$ includes one input terminal to which the signal source $140_4$ is connected and the other input terminal to which the reference potential is connected. The reference potential is described as being the ground, but the present disclosure is not limited thereto. The switch element $150_4$ is configured to switch between the closed state and the open state in accordance with the control signal from the signal source $140_4$.

The switch element $150_4$ includes one end to which the signal line 101 is electrically connected and the other end to which one end of the capacitor C1 is electrically connected. The other end of the capacitor C1 is connected to the reference potential. In this case, the switch element $150_4$ is configured to electrically connect the signal line 101 and the capacitor C1 by being in the closed state. The switch element $150_4$ is configured to electrically separate the signal line 101 from the capacitor C1 by being in the open state. The capacitance of the capacitor C1 is added to the impedance of the transmission circuit 28 by electrically connecting the signal line 101 and the capacitor C1. In other words, a reactance component of the impedance of the transmission circuit 28 changes due to addition of the capacitance of the capacitor C1. The capacitance of the capacitor C1 is, for example, 1.32 [pico Farad (pF)].

The capacitor circuit $120_2$ includes a signal source $140_5$, a switch element $150_5$, and a capacitor C2. The signal source $140_5$ indicates a signal source to which the control signal from the control circuit 27 is supplied. The signal source $140_5$ is configured to output the control signal to the switch element $150_5$ to control an opening/closing operation of the switch element $150_5$. The switch element $150_5$ includes one input terminal to which the signal source $140_5$ is connected and the other input terminal to which the reference potential is connected. The reference potential is described as being the ground, but the present disclosure is not limited thereto. The switch element $150_5$ is configured to switch between the closed state and the open state in accordance with the control signal from the signal source $140_5$.

The switch element $150_5$ includes one end to which the signal line 101 is electrically connected and the other end to which one end of the capacitor C2 is electrically connected. The other end of the capacitor C2 is connected to the reference potential. In this case, the switch element $150_5$ is configured to electrically connect the signal line 101 and the capacitor C2 by being in the closed state. The switch element $150_5$ is configured to electrically separate the signal line 101 from the capacitor C2 by being in the open state. The capacitance of the capacitor C2 is added to the impedance of the transmission circuit 28 by electrically connecting the signal line 101 and the capacitor C2. In other words, a reactance component of the impedance of the transmission circuit 28 changes due to addition of the capacitance of the capacitor C2. The capacitance of the capacitor C2 is, for example, 3.18 [pF].

The capacitor circuit 120₃ includes a signal source 140₆, a switch element 150₆, and a capacitor C3. The signal source 140₆ indicates a signal source to which the control signal from the control circuit 27 is supplied. The signal source 140₆ is configured to output the control signal to the switch element 150₆ to control an opening/closing operation of the switch element 150₆. The switch element 150₆ includes one input terminal to which the signal source 140₆ is connected and the other input terminal to which the reference potential is connected. The reference potential is described as being the ground, but the present disclosure is not limited thereto. The switch element 150₆ is configured to switch between the closed state and the open state in accordance with the control signal from the signal source 140₆. Note that one or more capacitor circuits among the capacitor circuits 120₁ to 120₃ may include one or more electrical elements among a plurality of inductor elements and the plurality of resistive elements.

The switch element 150₆ includes one end to which the signal line 101 is electrically connected and the other end to which one end of the capacitor C3 is electrically connected. The other end of the capacitor C3 is connected to the reference potential. In this case, the switch element 150₆ is configured to electrically connect the signal line 101 and the capacitor C3 by being in the closed state. The switch element 150₆ is configured to electrically separate the signal line 101 from the capacitor C3 by being in the open state. The capacitance of the capacitor C3 is added to the impedance of the transmission circuit 28 by electrically connecting the signal line 101 and the capacitor C3. In other words, a reactance component of the impedance of the transmission circuit 28 changes due to addition of the capacitance of the capacitor C3. The capacitance of the capacitor C3 is, for example, 7.68 [pF].

The resistive circuit 130 includes a signal source 140₇, a switch element 150₇, and a resistive element R1. The signal source 140₇ indicates a signal source to which the control signal from the control circuit 27 is supplied. The signal source 140₇ is configured to output the control signal to the switch element 150₇ to control an opening/closing operation of the switch element 150₇. The switch element 150₇ includes one input terminal to which the signal source 140₇ is connected and the other input terminal to which the reference potential is connected. The reference potential is described as being the ground, but the present disclosure is not limited thereto. The switch element 150₇ is configured to switch between the closed state and the open state in accordance with the control signal from the signal source 140₇.

The switch element 150₇ includes one end to which the signal line 101 is electrically connected and the other end to which one end of the resistive element R1 is electrically connected. The other end of the resistive element R1 is connected to the reference potential. In this case, the switch element 150₇ is configured to electrically connect the signal line 101 and the resistive element R1 by being in the closed state. The switch element 150₇ is configured to electrically separate the signal line 101 from the resistive element R1 by being in the open state. A resistance value of the resistive element R1 is added to the impedance of the transmission circuit 28 by electrically connecting the signal line 101 and the resistive element R1. In other words, the impedance of the transmission circuit 28 changes in the real component by the resistance value of the resistive element R1 being added. The resistance value of the resistive element R1 is, for example, 1 [milli-Ohm (mΩ)].

The control circuit 27 is configured to selectively change the impedance of the transmission circuit 28 to control the reflection coefficient to rotate on the polar chart by selectively controlling open/closed state of each of the switch elements 150₁ to 150₇. The control circuit 27 is configured to control the impedance of the transmission circuit 28 to rotate in the complex plane by causing any one of the switch elements 150₁ to 150₇ to be in the closed state or by causing all of the switch elements to be in the open state. Alternatively, the control circuit 27 may control the reflection coefficient to rotate by selecting the impedance of the transmission circuit 28 by causing the plurality of switch elements among the switch elements 150₁ to 150₇ to be in the closed state.

Specifically, the transmission circuit 28 is configured such that, when all of the switch elements 150₁ to 150₇ are in the open state, the reflection coefficient is located at 0° in the complex plane. The transmission circuit 28 is configured such that, when only the switch element 150₃ is in the closed state, the impedance is located at 45° in the complex plane. The transmission circuit 28 is configured such that, when only the switch element 150₂ is in the closed state, the impedance is located at 90° in the complex plane. The transmission circuit 28 is configured such that, when only the switch element 150₁ is in the closed state, the impedance is located at 135° in the complex plane. The transmission circuit 28 is configured such that, when only the switch element 150₄ is in the closed state, the impedance is located at −45° in the complex plane. The transmission circuit 28 is configured such that, when only the switch element 150₅ is in the closed state, the impedance is located at −90° in the complex plane. The transmission circuit 28 is configured such that, when only the switch element 150₆ is in the closed state, the impedance is located at −135° in the complex plane. The transmission circuit 28 is configured such that, when only the switch element 150₇ is in the closed state, the impedance is located at 180° in the complex plane.

The control circuit 27 may be configured to control the open/closed state of a predetermined switch element(s) among the switch elements 150₁ to 150₇ when reflecting the transmitted radio wave. The control circuit 27 may be configured to control the switch elements 150₁ to 150₇ such that the impedance is located at a rotational position in the complex plane, in accordance with output from the sensor 40. The control circuit 27 may be configured to control the switch elements 150₁ to 150₇ such that the impedance is located at the rotational position in the complex plane, based on the control signal transmitted from the outside of the wireless communication apparatus 1.

A method of implementing the single side band pertaining to the transmission circuit 28 will be described with reference to FIG. 5.

Figure 5:
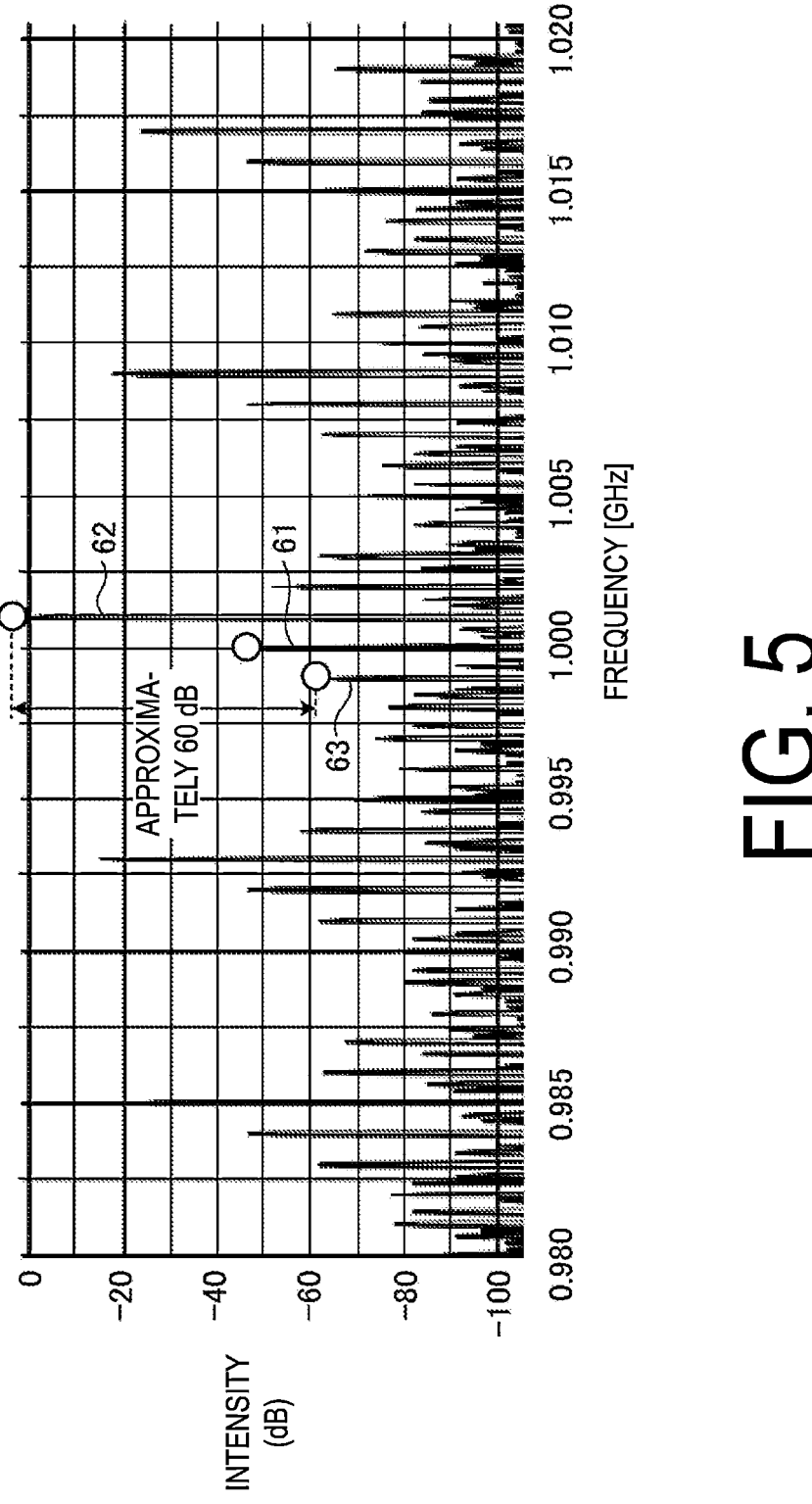
FIG. 5 is a diagram illustrating an example of a spectrum waveform of a backscatter signal implementing a single side band according to the first embodiment.

FIG. 5 illustrates a result example of analyzing the frequency spectrum of the backscatter signal when the reflection coefficient is rotated counterclockwise. A spectrum waveform of the backscatter signal (reflection signal) transmitted by the wireless communication apparatus 1 is illustrated. The horizontal axis represents frequency, and the vertical axis represents signal intensity. In FIG. 5, a carrier signal 61, a USB signal 62, and an LSB signal 63 are illustrated. The frequency of the carrier signal 61 is, for example, 1.0 [Giga Hertz (GHz)]. The frequency of the USB signal 62 is, for example, 1.001 [GHz]. The frequency of the LSB signal 63 is, for example, 0.999 [GHz]. The spectrum intensity of the carrier signal 61 illustrated in FIG. 5 is approximately −48 [Decibel (dB)]. The spectrum intensity of the USB signal 62 is approximately 0 [dB]. The spectrum intensity of the LSB signal 63 is approximately −60 [dB]. The difference in spectrum intensity between the USB signal 62 and the LSB signal 63 is −60 [dB]. In other words, in the spectrum waveform illustrated in FIG. 5, the LSB signal 63 is suppressed as compared with the USB signal 62, and thus the single side band of the USB signal 62 is implemented.

As described above, the transmission circuit 28 can implement the single side band by selectively changing the impedance of the transmission circuit 28 to control the reflection coefficient to rotate. In other words, the transmission circuit 28 can independently utilize both side bands, and improvement of the utilization efficiency of the frequency band can be doubled by controlling the impedance of the transmission circuit 28 so as to suppress either the LSB signal or the USB signal with respect to the carrier signal.

The transmission circuit 28 can implement the single side band of the backscatter signal without using a configuration such as a demultiplexer. Thus, the transmission circuit 28 does not require the configuration such as the demultiplexer, and thus the wireless communication apparatus of the backscatter system can be miniaturized.

Note that the transmission circuit 28 is described as controlling the impedance at eight points in the 450 increments of 0°, 45°, 90°, 135°, 180°, −135°, −90°, and −45° in the complex plane. These angles are exemplary and are not intended to limit the present disclosure. The number of points at which the impedance is rotationally controlled is not particularly limited, and may be three, four, six, ten or more. The number of points at which the impedance is rotationally controlled is preferably four or more. The number of points at which the impedance is rotationally controlled is preferably a multiple of four. In the points at which the impedance is rotationally controlled, angular intervals between points may be the same or different from each other. In the first embodiment, the angular intervals of the points for rotationally controlling the impedance includes not only a case where they exactly match with one another but also a case where they are sifted by a predetermined angle (for example, within 10°). In the first embodiment, an angle of a point serving as a reference for rotationally controlling the impedance may be shifted by any angle depending on a design. For example, if it is difficult to control the impedance of the point serving as the reference to 0°, the point may be shifted by about 20°.

Second Embodiment

Next, a transmission circuit according to a second embodiment of the present disclosure will be described. As described above, the transmission circuit 28 according to the first embodiment includes the inductor circuit 110, the capacitor circuit 120, and the resistive circuit 130 as the impedance circuit. However, the configuration of the transmission circuit of the present disclosure is not limited thereto. For example, the transmission circuit may be configured from the capacitor circuit 120 without including the inductor circuit 110 and the resistive circuit 130. In this case, the single side band can be implemented using the transmission circuit, a phase shifter that shifts a phase of the signal connected to the transmission circuit by 90°, and the switch element.

Figure 6:
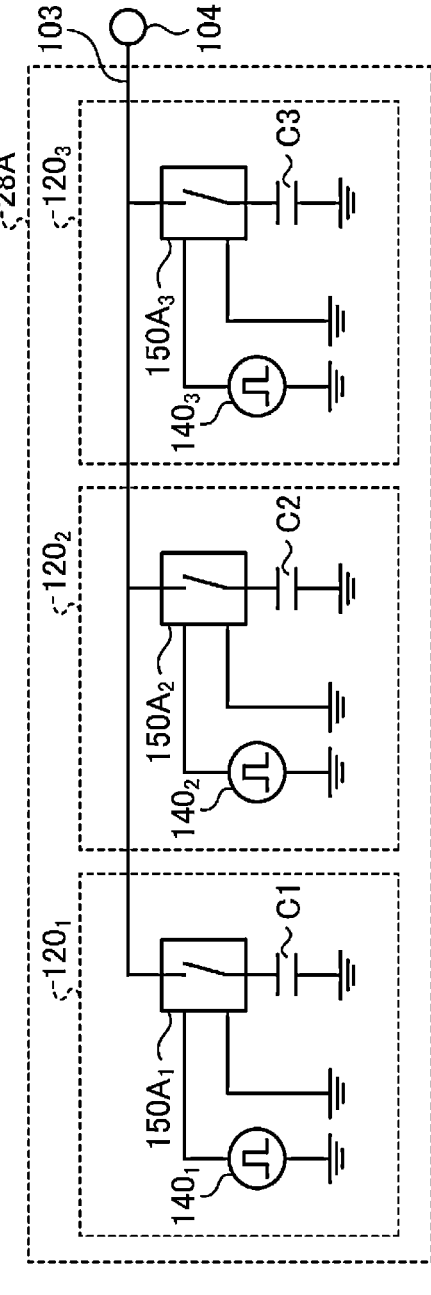
FIG. 6 is a diagram for describing an example of a configuration of a transmission circuit according to a second embodiment.

A configuration of the transmission circuit according to the second embodiment will be described with reference to FIG. 6. FIG. 6 is a diagram for describing an example of a configuration of the transmission circuit according to the second embodiment.

As illustrated in FIG. 6, the transmission circuit 28A includes the capacitor circuits 120₁ to 120₃. The capacitor circuit 120₁ includes the signal source 140₁ and a switch element 150A₁; the capacitor circuit 120₂ includes the signal source 140₂ and a switch element 150A₂; the capacitor circuit 120₃ includes the signal source 140₃ and a switch element 150A₃. When it is not necessary to particularly distinguish the switch elements 150A₁ to 150A₃ from one another, they may be collectively referred to as a switch element 150A. The switch element 150A is similar to the switch element 150 described in the first embodiment, and thus description thereof is omitted.

Capacitor circuits 120₁ to 120₃ are electrically connected to one another by a signal line 103. The signal line 103 is electrically connected to an input/output terminal 104. The capacitor circuits 120₁ to 120₃ are circuits used in rotationally controlling the reflection coefficient clockwise or counterclockwise from −135° to −90° and from −90° to 0° in the complex plane (polar chart).

The capacitor circuits 120₁ to 120₃ are similar to the capacitor circuits 120₁ to 120₃, respectively, described in the first embodiment. Specifically, capacitance of the capacitor C1 is 1.32 [pF]. The capacitance of the capacitor C2 is 3.18 [pF]. The capacitance of the capacitor C3 is 7.68 [pF].

The control circuit 27 can control the impedance of the transmission circuit 28A to rotate in the complex plane by controlling the open/closed state of each of the switch elements 150A₁ to 150A₃. The control circuit 27 is controllable to rotate the impedance of the transmission circuit 28A in the complex plane by causing any one of the switch elements 150A₁ to 150A₃ to be in the closed state or by causing all of the switch elements to be in the open state. The control circuit 27 may be controllable to rotate the impedance of the transmission circuit 28A in the complex plane by causing the plurality of switch elements among the switch elements 150A₁ to 150A₃ to be in the open state.

When all of the switch elements 150A₁ to 150A₃ are in the open state, the transmission circuit 28A is configured such that the impedance is located at 0° in the complex plane. When only the switch element 150A₁ is in the closed state, the transmission circuit 28A is configured such that the impedance is located at −45°. When only the switch element 150A₂ is in the closed state, the transmission circuit 28A is configured such that the impedance is located at −90°. When only the switch element 150A₃ is in the closed state, the transmission circuit 28A is configured such that the impedance is located at −135°. In other words, the control circuit 27 may control the position of the impedance on the complex plane with four-point switching by controlling the switch elements 150A₁ to 150A₃. The capacitor circuits 120₁ to 120₃ may be configured to rotationally control the impedance between −135° and −90° and between −90° and 0°. The control circuit 27 is configured to rotationally control the impedance of the transmission circuit 28A clockwise by sequentially causing only one of the switch elements 150A₁, 150A₂, and 150A₃ to be in the closed state. The control circuit 27 is configured to rotationally control the impedance of the transmission circuit 28A counterclockwise by sequentially causing only one of the switch elements 150A₃, 150A₂, and 150A₁ to be in the closed state.

Figure 7:
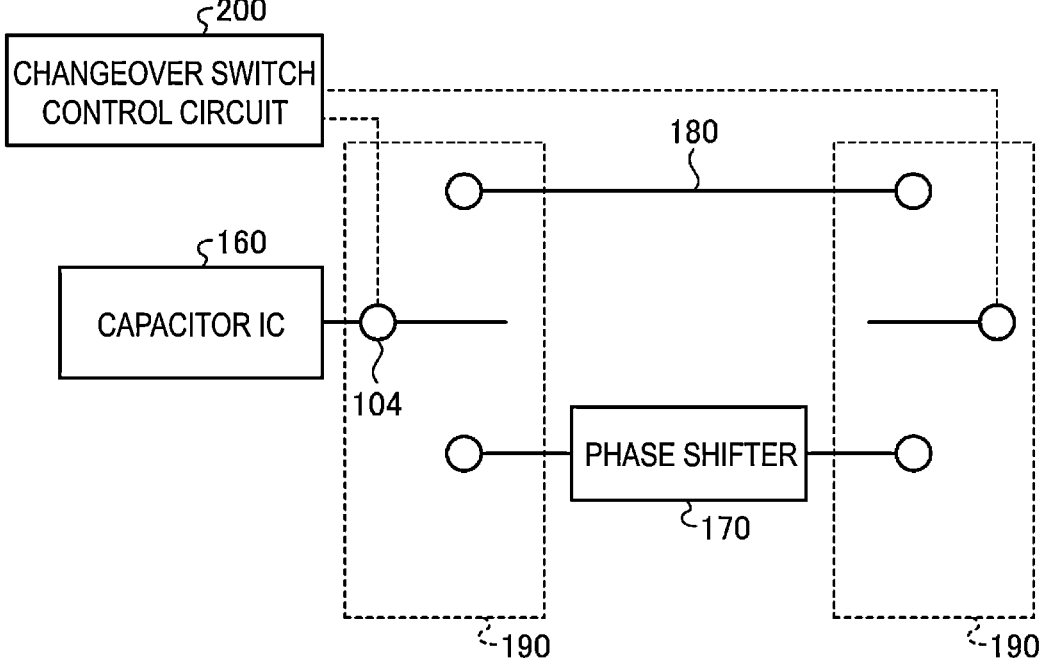
FIG. 7 is a diagram for describing a method of rotationally controlling impedance in a complex plane according to the second embodiment.

A method of rotationally controlling the impedance in the complex plane in the transmission circuit according to the second embodiment will be described with reference to FIG. 7. FIG. 7 is a diagram for describing a method of rotationally controlling the reflection coefficient in the complex plane according to the second embodiment (FIG. 6).

As illustrated in FIG. 7, the transmission circuit 28A (the capacitor circuits 120₁ to 120₃) illustrated in FIG. 6 may be integrated and used as a capacitor IC 160. In this case, the capacitor IC 160 is configured to be connected to either a phase shifter 170 or a signal line 180 by switching of a changeover switch element 190 by a changeover switch control circuit 200.

The phase shifter 170 includes a capacitor, an inductor, and a capacitor, which are not illustrated. The phase shifter 170 shifts a phase of the input signal by 90° to output the shifted signal.

The changeover switch control circuit 200 controls the changeover switch element 190 to connect the capacitor IC 160 and the signal line 180 when rotationally controlling the impedance between 0° and –90° and between –90° and –135°.

The changeover switch control circuit 200 controls the changeover switch element 190 to connect the capacitor IC 160 and the phase shifter 170 when rotationally controlling the impedance between 45° and 90° and between 90° and 180°. The position of the impedance on the complex plane can be controlled with eight-point switching by connecting the capacitor IC 160 and the phase shifter 170. By forming an integrated circuit in this manner, a configuration advantageous for miniaturization can be obtained.

A method of implementing the single side band according to the second embodiment will be described with reference to FIG. 8.

Figure 8:
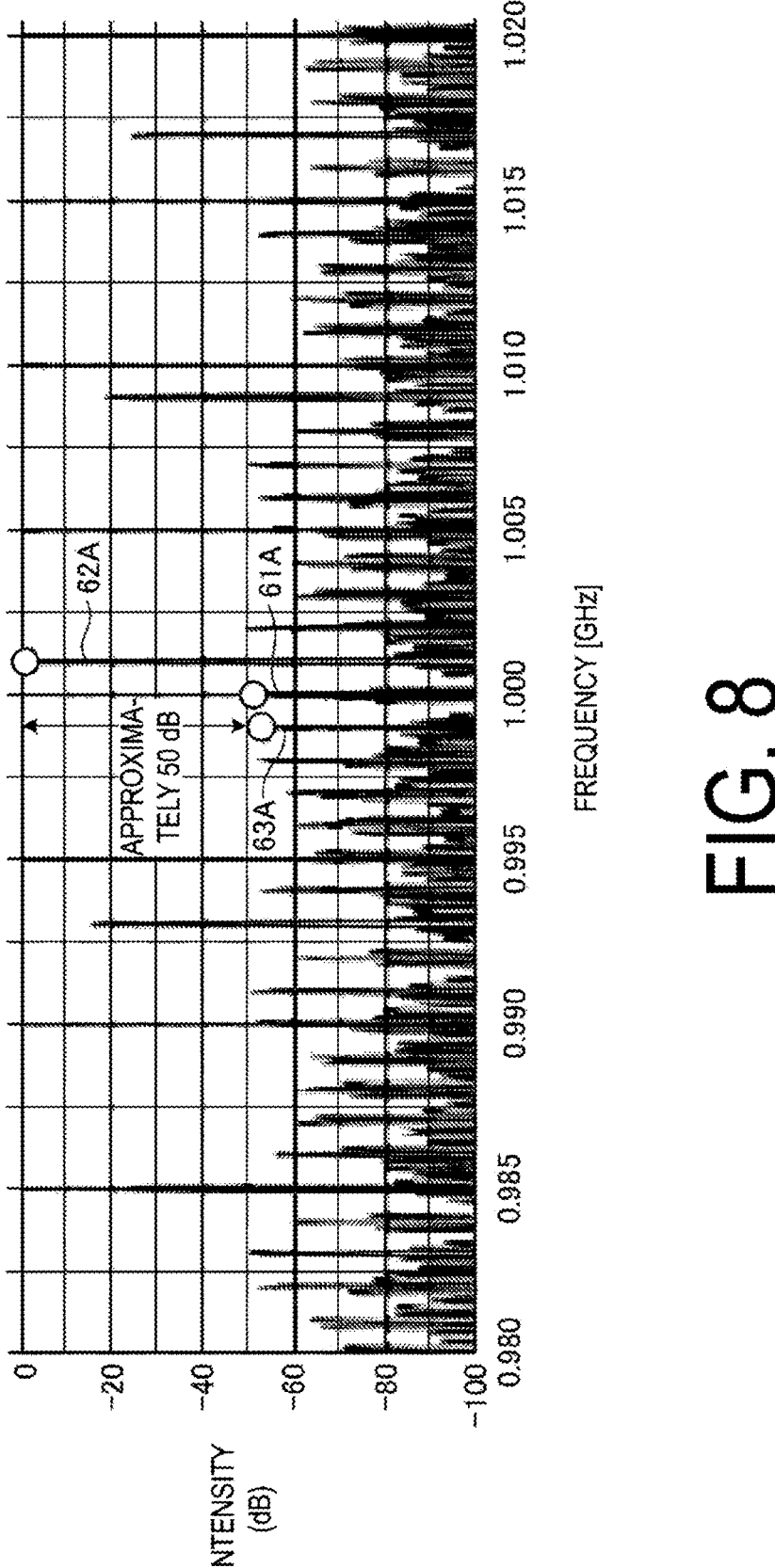
FIG. 8 is a diagram illustrating an example of a spectrum waveform of a backscatter signal implementing a single side band according to the second embodiment.

FIG. 8 illustrates an analysis result of the frequency spectrum of the backscatter signal when the reflection coefficient is rotated counterclockwise. A spectrum waveform of the backscatter signal transmitted by the wireless communication apparatus 1 is illustrated. In FIG. 8, a carrier signal 61A, a USB signal 62A, and an LSB signal 63A are illustrated. The frequency of the carrier signal 61A is, for example, 1.0 [GHz]. The frequency of the USB signal 62A is 1.001 [GHz]. The frequency of the LSB signal 63A is 0.999 [GHz]. The spectrum intensity of the carrier signal 61A is approximately –50 [dB]. The spectrum intensity of the USB signal 62A is approximately 0 [dB]. The spectrum intensity of the LSB signal 63A is approximately –50 [dB]. The difference in spectrum intensity between the USB signal 62A and the LSB signal 63A is approximately –50 [dB]. In other words, in the spectrum waveform illustrated in FIG. 8, the LSB signal 63 is suppressed as compared with the USB signal 62, and thus the single side band of the USB signal 62 is implemented.

In the second embodiment illustrated in FIG. 7, the use of the inductor having larger size than the resistive element and the capacitor can be reduced. In the second embodiment shown in FIG. 7, since it is easy to form an IC, the configuration is more advantageous for miniaturization.

Variation of Second Embodiment

Next, a configuration of a variation of the second embodiment according to the present disclosure will be described. In the second embodiment, only one phase shifter for shifting the phase is included, but the present disclosure is not limited thereto. In the present disclosure, a plurality of the phase shifters may be included.

Figure 9:
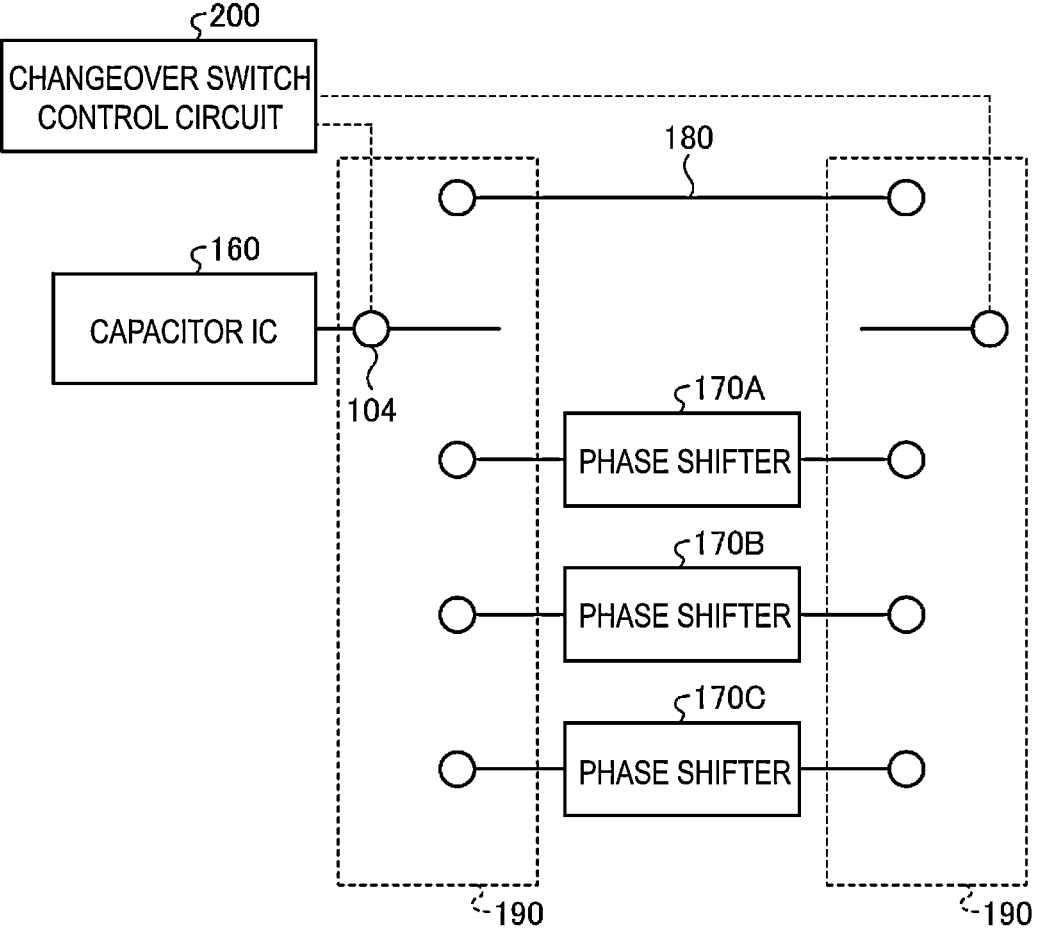
FIG. 9 is a diagram for describing a configuration of a variation of the second embodiment.

The configuration of the variation of the second embodiment will be described with reference to FIG. 9. FIG. 9 is a diagram for describing the configuration of the variation of the second embodiment.

In FIG. 9, a capacitor IC 160, phase shifters 170A, 170B, and 170C, and a changeover switch control circuit 200 are illustrated. The phase shifter 170A is, for example, a phase shifter configured to shift the phase by 45°. The phase shifter 170B is, for example, a phase shifter configured to shift the phase by 90°. The phase shifter 170C is, for example, a phase shifter configured to shift the phase by 135°.

In the example illustrated in FIG. 9, the capacitor IC 160 forms IC only for the capacitor circuit 120₁ of the transmission circuit 28A, for example. The changeover switch control circuit 200 is configured to control the changeover switch element 190 to connect the capacitor IC 160 and the phase shifter 170A when rotationally controlling the impedance between 0° and 90°. The changeover switch control circuit 200 is configured to control the changeover switch element 190 to connect the capacitor IC 160 and the phase shifter 170B when rotationally controlling the impedance between 90° and 180°. The changeover switch control circuit 200 is configured to control the changeover switch element 190 to connect the capacitor IC 160 and the phase shifter 170C when rotationally controlling the impedance between 180° and 270°. The changeover switch control circuit 200 is configured to control the changeover switch element 190 to connect the capacitor IC 160 and the signal line 180 when rotationally controlling the impedance between 270° and 360°. In the variation of the second embodiment, the transmission circuit including the plurality of phase shifters can be configured.

Third Embodiment

Next, a third embodiment according to the present disclosure will be described. In the third embodiment, a modulation processing is performed on the received signal to output the signal. In the third embodiment, the single side band of a modulated signal is implemented in a case where the wireless communication apparatus 1 modulates a signal by using the modulation of, for example, quadrature phase shift keying (QPSK) system.

Figure 10:
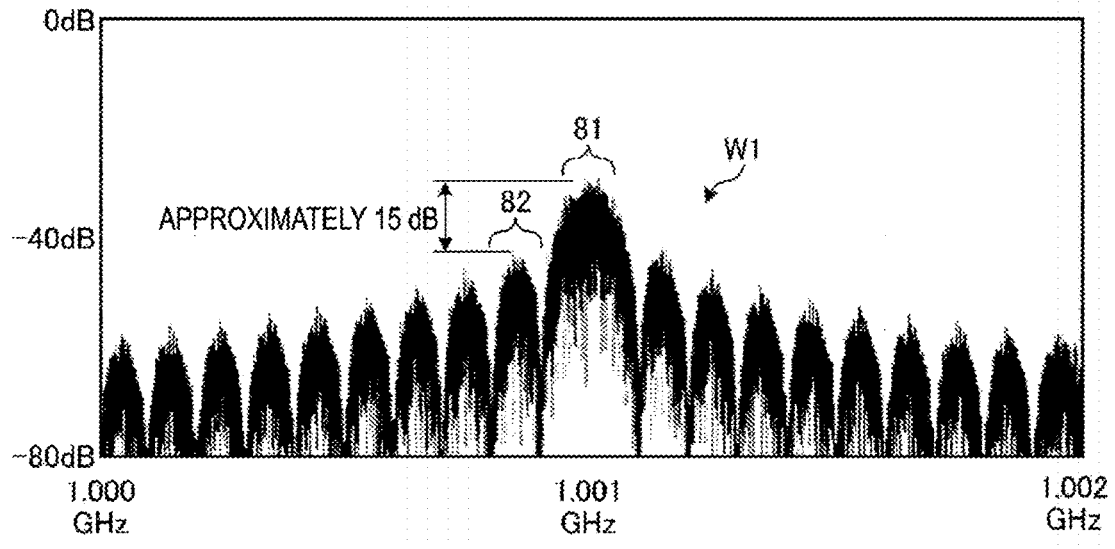
FIG. 10 is a diagram illustrating an example of a spectrum waveform of a modulation signal.

An example of a spectrum waveform of the modulation signal will be described with reference to FIG. 10. FIG. 10 is a diagram illustrating the example of the spectrum waveform of the modulation signal.

FIG. 10 illustrates a spectrum waveform W1 of a QPSK modulated backscatter signal. In FIG. 10, the horizontal axis is frequency, and the vertical axis is intensity. As illustrated in FIG. 10, the QPSK modulated backscatter signal is a waveform extending in the horizontal axis. In this case, the difference between a USB signal 81 and a signal 82 adjacent to the USB signal 81 is approximately 15 dB. In the third embodiment, a QPSK modulation system is provided that increases usage efficiency of frequency.

Figure 11:
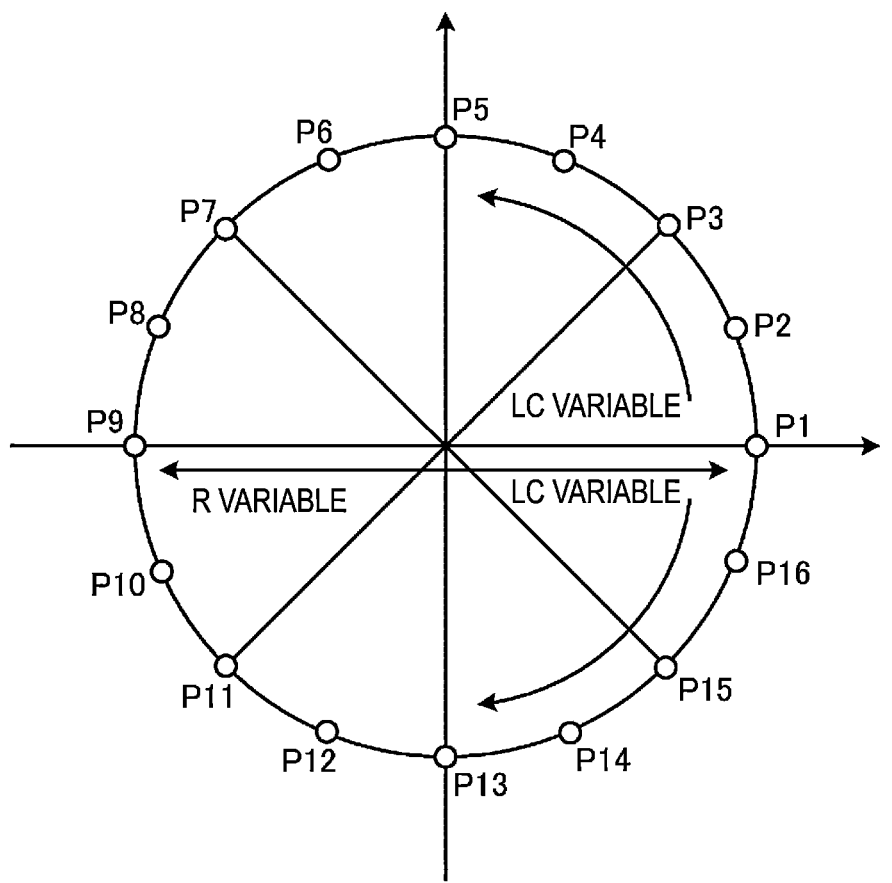
FIG. 11 is a diagram for describing QPSK modulation according to a third embodiment.

The QPSK modulation according to the third embodiment will be described with reference to FIG. 11. FIG. 11 is a diagram for describing the QPSK modulation according to the third embodiment.

FIG. 11 illustrates a signal point arrangement diagram of the QPSK signal according to the third embodiment. In the signal point arrangement diagram, 16 points of points P1 to P16 are illustrated. The phase of the point P1 is 0°. The phase of the point P2 is 22.5°. The phase of the point P3 is 45°. The phase of the point P4 is 67.5°. The phase of the point P5 is 90°. The phase of the point P6 is 112.5°. The phase of the point P7 is 135°. The phase of the point P8 is 157.5°. The phase of the point P9 is 180°. The phase of the point P10 is 202.5°. The phase of the point P11 is 225°. The phase of the point P12 is 247.5°. The phase of the point P13 is 270°. The phase of the point P14 is 292.5°. The phase of the point P15 is 315°. The phase of the point P16 is 337.5°. Each phase of the points P1 to P16 can be implemented by, for example, an application of a combination (see FIG. 7) of the transmission circuit 28A that switches the capacitors with the switches, the phase shifters, and the changeover switches, described in the second embodiment.

In the QPSK modulation, four signals whose phases change for each 900 are usually used. In the example illustrated in FIG. 11, the point P3 having the phase of 45°, the point P7 having the phase of 135°, the point P11 having the phase of 225°, and the point P15 having the phase of 315° are used. For example, when the QPSK signal changes from the point P3 to the point P7 in the QPSK modulation, the phase changes rapidly.

In the third embodiment, the wireless communication apparatus 1 is configured to continuously change the phase in the QPSK modulation by using the 16 phases illustrated in FIG. 11. For example, the phase of the QPSK signal is controlled to change by 0°, ±90°, or 180° while one symbol length rotates ten times. For example, changing from the point P3 to the point P7 illustrated in FIG. 11 is made via the points P4, P5, P6, and P7, and thus the phase changes with an advance of four times while one symbol length rotates ten times. For example, changing from the point P3 to the point P15 is made via the points P2, P1, P16, and P15, and thus the phase changes with a delay of four times. In other words, the wireless communication apparatus 1 is configured so as to slowly change the phase in the QPSK modulation by using the 16 phases. In other words, the wireless communication apparatus 1 is configured to be able to quasi-continuously change the phase.

Figure 12:
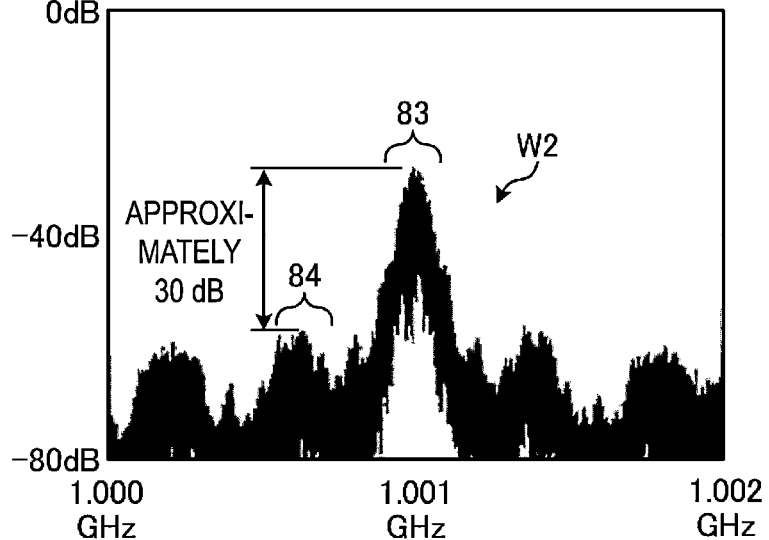
FIG. 12 is a diagram for describing an example of a spectrum waveform of a modulation signal according to the third embodiment.
Figure 13:
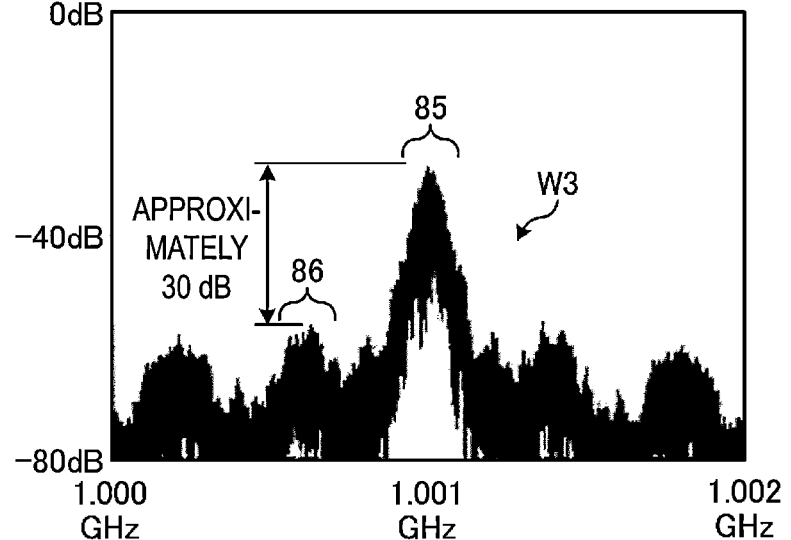
FIG. 13 is a diagram illustrating an example of the spectrum waveform of the modulation signal according to the third embodiment.

Examples of a spectrum waveform of the modulation signal according to the third embodiment will be described with reference to FIGS. 12 and 13. FIGS. 12 and 13 are diagrams illustrating the examples of the spectrum waveform of the modulation signal according to the third embodiment.

FIG. 12 illustrates a spectrum waveform W2 when the wireless communication apparatus 1 quasi-continuously advances the phase. In this case, the difference between a USB signal 83 and a signal 84 adjacent to the USB signal 83 is approximately 30 dB. In other words, the wireless communication apparatus 1 can increase the utilization efficiency of the frequency by quasi-continuously advancing the phase.

FIG. 13 illustrates a spectrum waveform W3 when the wireless communication apparatus 1 quasi-continuously delays the phase. In this case, the difference between a USB signal 85 and a signal 86 adjacent to the USB signal 85 is approximately 30 dB. In other words, the wireless communication apparatus 1 can increase the utilization efficiency of the frequency by quasi-continuously delaying the phase.

As described above, in the third embodiment, the wireless communication apparatus 1 can suppress the signal adjacent to the USB signal of the backscatter signal in the QPSK modulation. Accordingly, the wireless communication apparatus 1 can improve the utilization efficiency of the frequency even in the QPSK modulation.

In the present embodiment, the method of controlling the reflection coefficient by using the phase modulation is described, but the present disclosure is not limited thereto. In the present disclosure, for example, the reflection coefficient can be also controlled by performing frequency modulation on the SSB signal by changing the rotational speed of the reflection coefficient in accordance with digital information.

The embodiments of the present disclosure have been described above, but the present disclosure is not limited by the contents of these embodiments. The components described above include elements that can be easily conceived by those skilled in the art, elements that are substantially the same, and elements in a so-called equivalent range. Furthermore, the components described above can be combined as appropriate. Furthermore, various omitted, substituted, or modified components can be made without departing from the spirit of the above-described embodiments.

The invention claimed is:

1. A transmission circuit configured to be connected to an antenna, the transmission circuit comprising:
   a plurality of impedance circuits having impedances different from each other; and
   a plurality of first switch elements, any one of the plurality of first switch elements being connected to a respective one of the plurality of impedance circuits; and
   a first control circuit configured to control opening and closing of the plurality of first switch elements, wherein
   the first control circuit is configured to implement a single side band by selectively changing the opening and closing of the plurality of first switch elements and rotating a reflection coefficient of an output terminal on an antenna side of the transmission circuit in a complex plane to reduce an upper side band (USB) or a lower side band (LSB), the USB and LSB being frequency components offset from a carrier signal in a reflection signal transmitted by a wireless communication apparatus including the transmission circuit.

2. The transmission circuit according to claim 1, wherein the plurality of impedance circuits comprises a plurality of inductor circuits configured to adjust inductance among reactance components of impedance.

3. The transmission circuit according to claim 2, wherein the plurality of inductor circuits has impedances different from each other.

4. The transmission circuit according to claim 2, wherein at least one of the plurality of inductor circuits comprises a plurality of inductor elements.

5. The transmission circuit according to claim 2, wherein at least one of the plurality of inductor circuits comprises a resistive element.

6. The transmission circuit according to claim 2, wherein at least one of the plurality of inductor circuits comprises a capacitor element.

7. The transmission circuit according to claim 1, wherein the first control circuit is configured to be controllable to selectively change the opening and closing of the plurality of first switch elements and to rotate impedance at equal interval in the complex plane.

8. The transmission circuit according to claim 1, wherein the plurality of impedance circuits comprises a plurality of capacitor circuits configured to adjust capacitance among reactance components of impedance.

9. The transmission circuit according to claim 8, wherein the plurality of capacitor circuits has impedances different from each other.

10. The transmission circuit according to claim 8, wherein at least one of the plurality of capacitor circuits comprises a plurality of capacitor elements.

11. The transmission circuit according to claim 8, wherein at least one of the plurality of capacitor circuits comprises a resistive element.

12. The transmission circuit according to claim 8, wherein at least one of the plurality of capacitor circuits comprises an inductor element.

13. The transmission circuit according to claim 1, wherein the first control circuit is configured to be controllable to change impedance to rotate the reflection coefficient in the complex plane by controlling the plurality of first switch elements to close any one of the plurality of first switch elements.

14. The transmission circuit according to claim 1, wherein the first control circuit is configured to be controllable to change impedance to rotate the reflection coefficient in the complex plane by controlling the plurality of first switch elements to close any one of the plurality of first switch elements or to open all of the plurality of first switch elements.

15. The transmission circuit according to claim 1, wherein the first control circuit is configured to be controllable to rotate impedance in the complex plane by controlling the plurality of first switch elements to close any one of the plurality of first switch elements, to close at least two of the plurality of first switch elements, or to open all of the plurality of first switch elements.

16. The transmission circuit according to claim 1, wherein the first control circuit is configured to be controllable to rotate impedance in the complex plane by controlling the plurality of first switch elements to close at least two of the plurality of first switch elements or to open all of the plurality of first switch elements.

17. The transmission circuit according to claim 1, wherein the transmission circuit comprises a plurality of phase shifter circuits rotating a phase during transmission, a plurality of second switch elements, any one of the plurality of second switch elements being connected to a respective one of the plurality of phase shifter circuits, and a second control circuit configured to control opening and closing of the plurality of second switch elements, the second control circuit being configured to be controllable to change the opening and closing of the plurality of second switch elements, to change impedance, and to rotate a reflection coefficient with respect to the antenna in the complex plane.

18. The transmission circuit according to claim 17, wherein the second control circuit is configured to be controllable to change impedance by closing any one of the plurality of second switch elements and to rotate the reflection coefficient with respect to the antenna in the complex plane.

19. The transmission circuit according to claim 17, wherein the second control circuit is integrated with the first control circuit.

* * * * *